United States Patent [19]

Dijkshoorn

[11] Patent Number: 5,130,499
[45] Date of Patent: Jul. 14, 1992

[54] FLEXIBLE CIRCUIT AND A DEVICE FOR HOLDING THE FLEXIBLE CIRCUIT IN THE FOLDED STATE

[75] Inventor: Frank J. J. Dijkshoorn, Veghel, Netherlands

[73] Assignee: E. I. Du Pont de Nemours and Company, Wilmington, Del.

[21] Appl. No.: 694,512

[22] Filed: Apr. 25, 1991

[30] Foreign Application Priority Data

Apr. 27, 1990 [NL] Netherlands .......................... 9001026

[51] Int. Cl.$^5$ .............................................. H05K 1/00
[52] U.S. Cl. .................................. 174/254; 174/117 F; 174/138 R
[58] Field of Search ........... 174/254, 258, 268, 138 R, 174/138 G, 139, 145, 158 R, 168, 117; 29/835, 628, 846; 361/408; 428/35.7

[56] References Cited

U.S. PATENT DOCUMENTS

| | | | |
|---|---|---|---|
| 3,573,345 | 4/1971 | Devries | 174/254 X |
| 3,971,127 | 7/1976 | Giguere | 29/628 X |
| 4,060,889 | 12/1977 | Zielinski | 29/628 |
| 4,435,614 | 3/1984 | McAusland | 174/117 |
| 4,730,146 | 3/1988 | Maser | 174/117 X |
| 4,763,035 | 8/1988 | Zeeman | 29/835 X |
| 4,788,846 | 12/1988 | Morita et al. | 29/846 |
| 4,845,315 | 7/1989 | Stopper | 361/408 X |
| 5,006,382 | 4/1991 | Squire | 428/35.7 |

Primary Examiner—Leo P. Picard
Assistant Examiner—Trinidad Korka

[57] ABSTRACT

By folding two or more mutually connected strips of flexible printed circuit film material, an elongated flexible printed circuit comprising a main strip and one or more side strips being produced, with a minimum waste of film material. For holding the flexible circuit in its folded state and controlling the bending radii of the strips, a holding clip which locks automatically on the film material being provided.

13 Claims, 3 Drawing Sheets

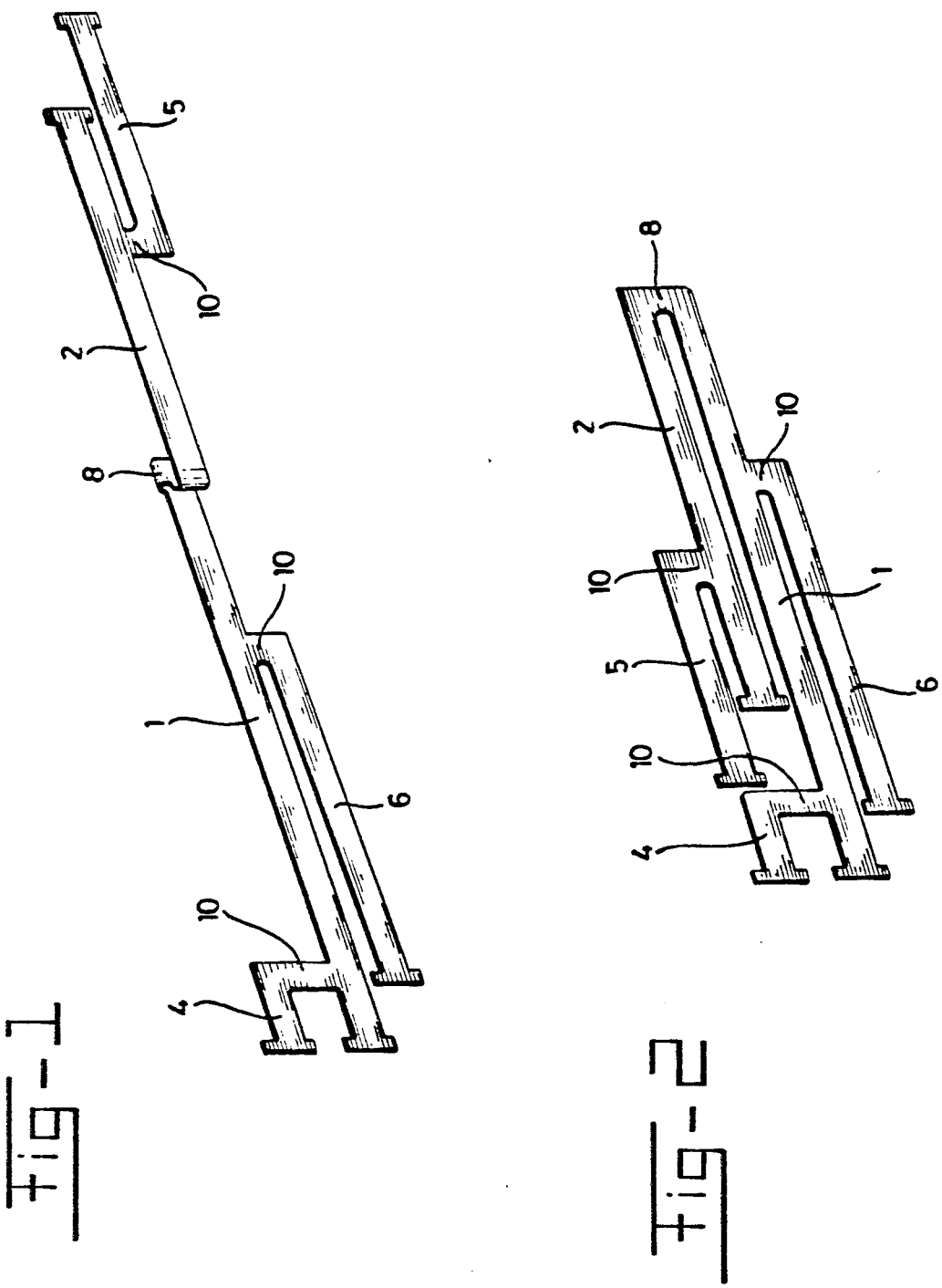

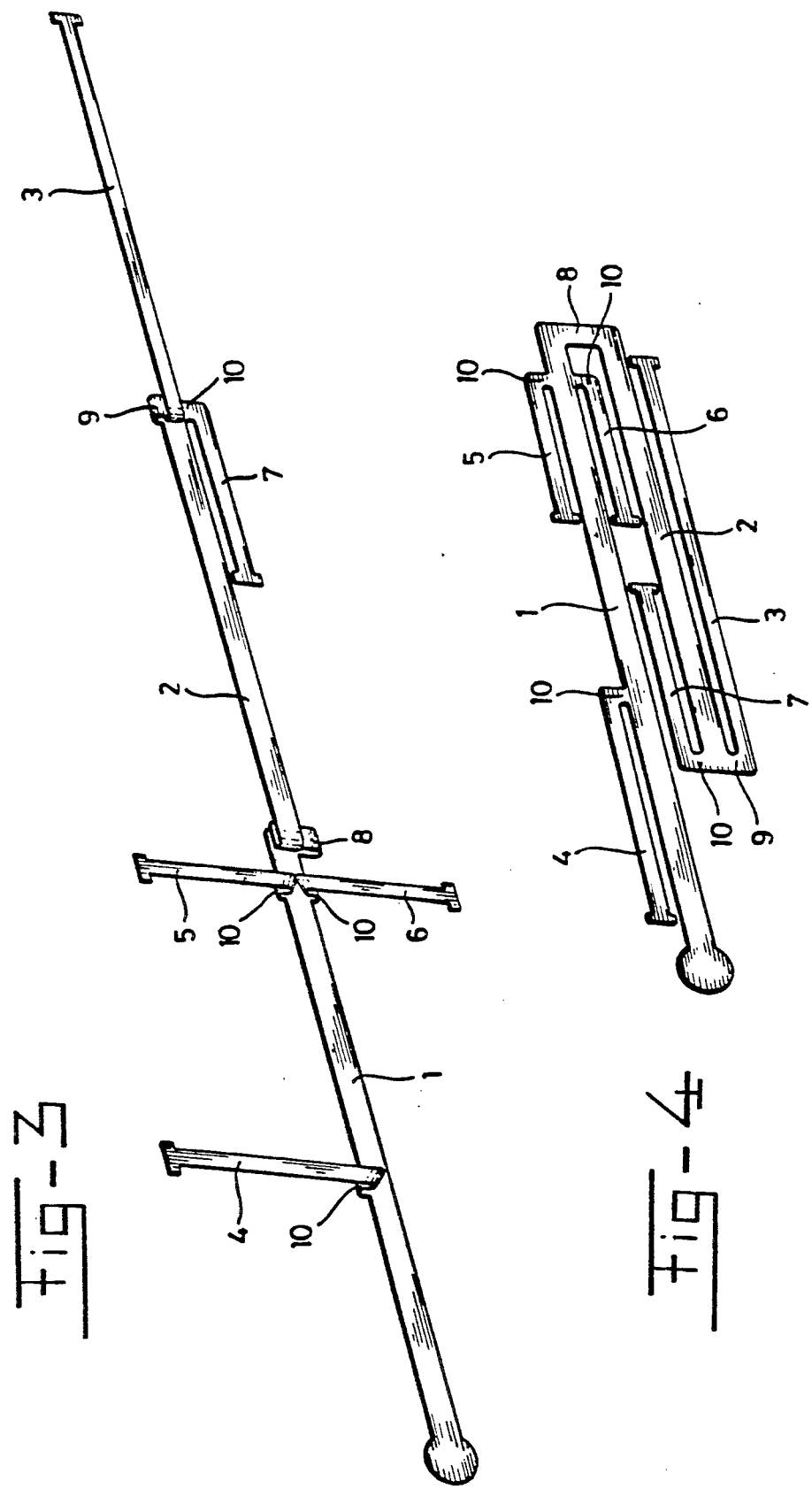

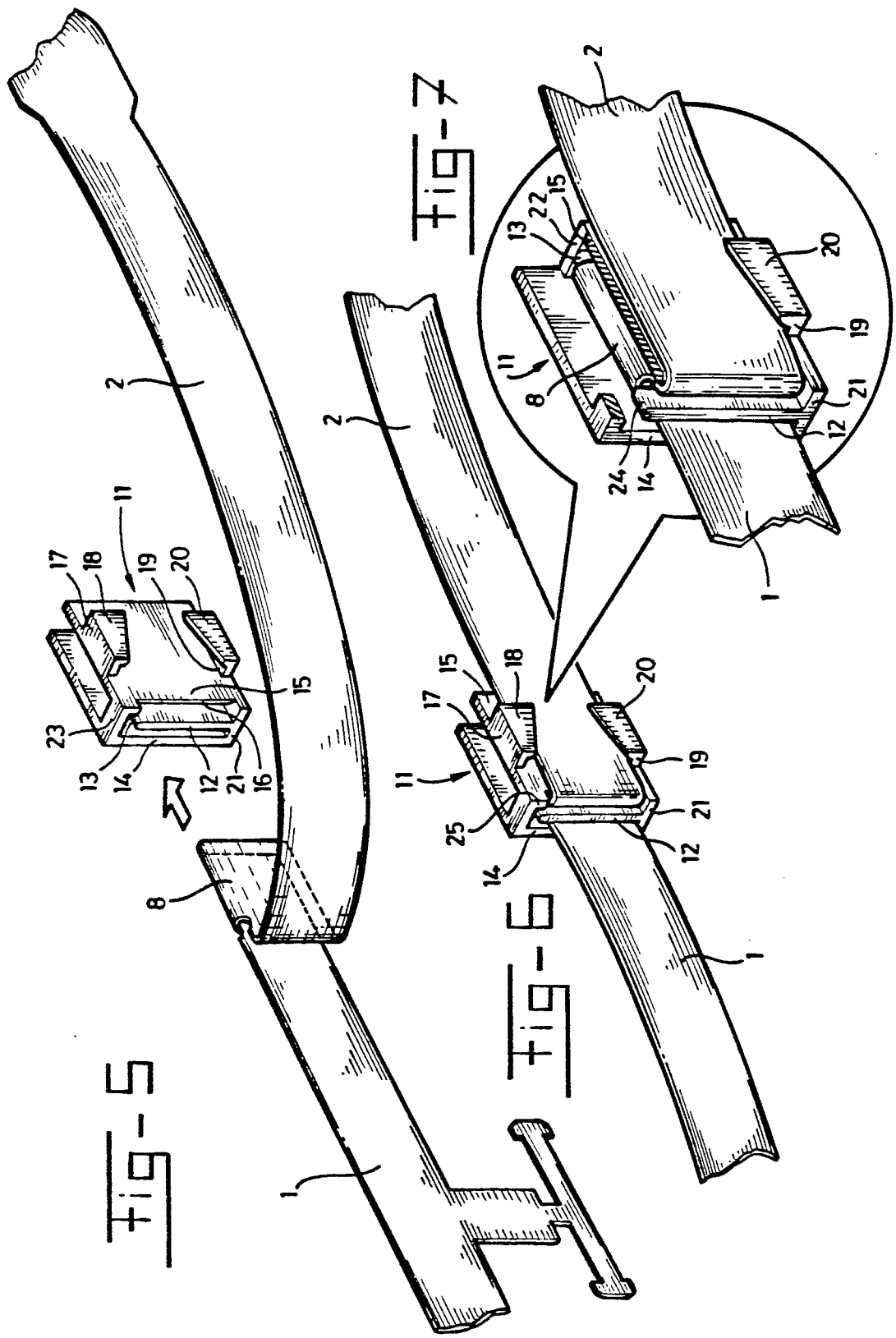

FLEXIBLE CIRCUIT AND A DEVICE FOR HOLDING THE FLEXIBLE CIRCUIT IN THE FOLDED STATE

BACKGROUND OF THE INVENTION

The invention relates to a flexible circuit, comprising a flexible film and a circuit provided thereon, said film comprising a main strip and at least one side strip.

The use of flexible circuits, also known as flexible films, in switch boxes and gearboxes of motor vehicles is becoming increasingly common. In this case these circuits lie in transmission oil which has a temperature range of −30° C. to +150° C. The film material suitable for this application is therefore very expensive.

SUMMARY OF THE INVENTION

The object of the invention is to provide a flexible circuit of the type mentioned in the preamble, produced with a minimum waste of said expensive film material.

The object is achieved according to the invention in that the main strip is formed by folding from at least two partial main strips which run next to and at a distance from each other, and which are connected to each other at adjacent ends by a main connecting strip, the main connecting strip being folded double, and one partial main strip being folded until it is in line with the other.

This achieves a layout of the not yet folded initial state of the film in which a minimum of basic material is needed.

In a further development of the invention the side strip is formed by folding from a side strip which initially runs next to and at a distance from the corresponding partial main strip and is connected at one end to the partial main strip by means of a side connecting strip, the side connecting strip being folded double and the side strip being folded until it is at right angles to the corresponding partial main strip.

It is, however, extremely important that this folding should not be carried out with too small a bending radius, since otherwise the risk is too great that the etched copper tracks on the flexible film will break.

In order to overcome this, the invention relates to a device for holding a flexible circuit in a folded state, which is characterized by at least one spacer with contact faces spaced apart and extending from one free bending edge thereof for parts of a connecting strip folded towards each other round the bending edge, and by holding means for holding the connecting strip parts along the contact faces.

The minimum bending radius is determined here by the thickness of the spacer.

According to one embodiment of the invention, the holding means comprise a retaining face which runs at a distance from the corresponding contact face of the spacer which is at least equal to the thickness of the flexible circuit.

If the bending radius of the second fold of the flexible circuit also must not be too small, according to a development of the invention, a retaining face is formed by a contact face of a second spacer extending parallel to the first spacer for the fold of the partial main strip or side strip, while the contact face of the second spacer facing away from the first spacer is provided with holding means for the part of the flexible circuit running along this contact face.

According to one embodiment of the invention, these holding means are formed by L-shaped holding elements, the one legs of which extend from the contact face of the second spacer facing away from the first spacer substantially parallel thereto and to the bending edge of the second spacer and at a distance of at least the width of the flexible circuit to be placed between the one legs, and the second legs of which point with the free ends towards each other, while the distance between the second legs and the relevant contact face of the second spacer is at least equal to the thickness of the flexible circuit.

The free ends of the second legs of the holding elements are preferably bevelled in such a way that the distance between the facing end faces thereof increases towards the bending edge of the second spacer.

The bending edges of the spacers are also preferably rounded off.

Further embodiments of the invention are described in the sub-claims.

The invention will be explained below in greater detail with reference to the drawings.

BRIEF DESCRIPTION OF THE DRAWINGS

FIG. 1 shows an embodiment of a flexible circuit according to the invention;

FIG. 2 shows the layout of the flexible circuit according to FIG. 1, in the unfolded state;

FIGS. 3 shows another embodiment of the flexible circuit according to the invention;

FIG. 4 shows the layout of the flexible circuit shown in FIG. 3, in the unfolded state;

FIG. 5 shows an embodiment of a holding device or holding clamp with the folded flexible circuit according to the invention to be fitted therein;

FIG. 6 shows an embodiment according to the invention of a holding clamp fitted on a flexible circuit; and FIG. 7 shows a holding clamp according to FIG. 6, in which for the sake of clarity a part is broken away.

DETAILED DESCRIPTION OF THE EMBODIMENTS

The flexible circuit shown in FIG. 1 comprises two partial main strips 1, 2, which are connected by a main connecting strip 8. The main connecting strip 8 is folded double, while the partial main strip 2 is bent in such a way that it comes to lie in line with the partial main strip 1. The partial main strip 1 is provided with side or branch strips 4, 6 which are connected to the partial main strip 1 by mean of the side connecting strips 10. The same applies to the partial main strip 2 and its side strip 5. The free ends of the partial main strips 1 and 2 and the side strips 4, 5, 6 are provided with transverse strips for connection purposes.

FIG. 2 shows the layout of the flexible circuit according to FIG. 1 in the not yet folded state. The corresponding parts are provided with the same reference numbers. As can be seen from FIG. 2, the flexible circuit according to FIG. 1 can be produced with a minimum waste of material and, after cutting out of the partial main strips 1, 2, the side strips 4, 5, 6 and their connecting strips, the flexible circuit according to FIG. 1 can be produced, while the desired length of the main strip of the flexible circuit can be obtained.

It is pointed out that the side strips 4, 5, 6 are not yet bent in the desired position.

FIGS. 3 and 4 show a flexible circuit which, in order to obtain the desired length of the main strip, comprises three partial main strips 1, 2, 3 which are interconnected by the main connecting strips 8, 9 respectively. The main connecting strips and the partial main strips are bent in the same way as in the case of the flexible circuit according to FIGS. 1 and 2. The partial main strip 1 is connected to the side strips 4, 5 and 6 by means of the side connecting strips 10. The side strip 7 is connected by means of the side connecting strip 10 to the partial main strip 2 at the main connecting strip 9 of the partial main strips 2 and 3. After folding of their side connecting strips 10, the side strips 4, 5 and 6 are bent in the crosswise direction of the partial main strip 1. The minimal waste of the basic material can be seen from FIG. 4.

It is, however, extremely important that the folds described in the flexible circuit should take place with controlled bending radii, because otherwise the risk of the etched copper tracks breaking is too great. An embodiment of the holding clamp or clip which is preferably used and which meets the above-mentioned requirement is shown in FIGS. 5 to 7. FIG. 5 shows a part of the flexible circuit which comprises the partial main strips 1 and 2 and the main connecting strip 8, which are bent into a shape which is suitable for inserting the clip 11. The flexible circuit is inserted in the clip in the direction of the arrow in FIG. 5. In FIG. 6 the flexible circuit is shown in the position inserted in the clip 11. FIG. 7 shows this position on an enlarged scale, in which for the sake of clarity a part of the clip is removed.

The clip 11 comprises a spacer 12 with free bending edge 13 around which the folded part of the main connecting strip 8 rests, while the two folded faces thereof lie against the side faces of the spacer 12. The thickness of the spacer 12, in particular near the bending edge 13, determines the bending radius of the above-mentioned fold, so that through the selection of this thickness a minimum bending radius is ensured. The bending edge 13 is preferably rounded off. The rounding-off means that the risk of damage to the copper tracks is reduced to a minimum.

The folded flexible circuit is held in the position slid into the clip by the retaining faces which are formed by the wall 14 of the side plate and a second spacer 15. The bent parts of the flexible circuit fit into the spaces bounded by the wall 14 and the first spacer 12, and the first spacer 12 and the second spacer 15 respectively. The bending edge 16 of the second spacer 15 is also rounded off in order to avoid damage to the copper tracks.

The second spacer 15 is provided with holding means for holding the partial main strip 2 of the flexible circuit resting against the outer face of the second spacer 15. These holding means are formed by holding elements 17, 18 and 19, 20 respectively. The one legs 17, 19 of the L-shaped holding elements extend outwards at right angles to the outer face of the second spacer 15. The distance between said legs of the holding elements is at least equal to the width of the part of the flexible circuit to be placed between the legs. This part of the flexible circuit is held in place by the second legs 18, 20 of the holding elements. It is clear that the part of the flexible circuit which is fitted against the second spacer 16 fits as regards thickness into the space bounded by the outer face of the second spacer 15 and the inside of the second legs 18, 20. These legs 18, 20 are bevelled off at the end faces facing each other, while the distance between the relevant end faces increases towards the bending edge 16 of the second spacer 15. This facilitates the placing of the part of the partial main strip 2 against the second spacer 15. The above-mentioned end faces are preferably rounded off.

In this embodiment of the holding clip, the bending edge 16 of the second spacer 15 is at right angles to the bending edge 13 of the first spacer 12. If the strip 2 of the flexible circuit has to be directed at right angles to the strip 1 thereof, the bending edge 16 can run at an angle of, for example, 45 relative to bending edge 13. In this case the holding elements 17, 18 and 19, 20 must be in a different position, and the one legs 17, 19 of the holding elements must run at right angles to the bending edge 16. The shape of the second spacer would then deviate from the rectangular shape. It is clear that other shapes of holding elements are also possible.

The first and second spacers 12, 15 are connected to each other means of a first connecting element 21 or are integral therewith. In the embodiment shown, the connecting element 21 is integral with the side plate 14. Further, a second connecting element 22, which in this embodiment is integral with the first and second spacer 12, 15 and the side element 14, is present. Through this configuration, the flexible circuit is fixed well in the folded state.

A connecting bar 23 which connects the side plate or side element 14 to the second spacer 15 is present at a distance from the bending edge 13 of the first spacer 12. It is clear that the distance between the inside of this connecting bar 23 and the bending edge 13 of the first spacer is large enough to place the fold in the flexible circuit 1, 2.

The bending edge 13 of the first spacer 12 is provided with a raised part 24 which extends past the bending edge. The function of this raised part is to ensure that the fold of the flexible circuit 1, 2 lying around the bending edge 13 cannot easily slip out of the holding clip 11.

The element 25 has a similar function, ensuring that the fold made over the bending edge 16 of the second spacer 15 is held in place. This element 25 is produced through the fact that the bending edge 16 of the spacer 15 lies at a distance from the insertion face of the holding clip 11. The length between the element 25 and the connecting element 21 is, of course, equal to or greater than the width of the strip 2 of the flexible circuit.

The holding clip is preferably made of insulating material, so that short circuits between copper tracks are ruled out.

It can be seen clearly from FIGS. 5, 6 and 7 that the clip can be slid easily over the pre-bent film and locks automatically.

I claim:
1. In combination a flexible circuit and a device for holding said flexible circuit in a double-folded position, said combination comprising
   a flexible circuit formed of a flexible film and an electrical circuit provided thereon, said film including a main strip and at least one side strip, wherein the main strip is formed by folding from at least two partial main strips (1, 2) which run next to and at a distance from each other, and which are connected to each other at adjacent ends by a main connecting strip (8), the main connecting strip being folded double ad one partial main strip being folded until it is in line with the other, and
   a device for holding the flexible circuit in said double-folded position and having at least one spacer (12) with contact faces spaced apart and extending from one free rounded bending edge (13) thereof for parts of the main connecting strip (8, 9, 10) folded towards each other around the bending edge, and by holding means for holding the connecting strip parts along the contact faces.

2. The combination of claim 1, wherein the side strip is formed by folding from a side strip (4, 5, 6 or 7) which runs next to and at a distance from the corresponding partial main strip and is connected at one end to the partial main strip (1, 2, 3) by means of a side connecting strip (10), the side connecting strip being folded double, and the side strip being folded until it is at right angles to the corresponding partial main strip.

3. The combination of claim 1, wherein the holding means comprise a retaining face (14, 15) which runs at a distance from the corresponding contact face of the spacer (12) which is at least equal to the thickness of the flexible circuit.

4. The combination of claim 3 wherein a retaining face is formed by a contact face of a second spacer (15) extending parallel to the first spacer (12) for the fold of the partial main strip or side strip, while the contact face of the second spacer (15) facing away from the first spacer (12) is provided with holding means (17, 18, 19, 20) for the part of the flexible circuit running along this contact face.

5. A device according to claim 4, wherein the holding means are formed by L-shaped holding elements (17, 18, 19, 20), the one legs (17, 19) of which extend from the contact face of the second spacer (15) facing away from the first spacer (12) substantially parallel thereto and to the bending edge (16) of the second spacer (15) and at a distance of at least the width of the flexible circuit to be placed between the one legs, and the second legs (18, 20) of which point with the free ends towards each other, while the distance between the second legs and the relevant contact face of the second spacer (15) is at least equal to the thickness of the flexible circuit.

6. The combination of to claim 5, wherein the free ends of the second legs (18, 20) of the holding elements are bevelled in such a way that the distance between the facing end faces thereof increases towards the bending edge (16) of the second spacer (15).

7. The combination of claim 4, wherein the first and second spacers (12, 15) are connected to each other by means of a first connecting element (21) extending parallel to the bending edge (13) of the first spacer (12).

8. The combination of claim 4, wherein the first and second spacers (12, 15) are connected to each other by means of a second connecting element (22) which extends at right angles to the bending edge (13) of the first spacer (12).

9. The combination of claim 4, wherein the bending edge (16) of the second spacer (15) lies at an angle relative to that of the first spacer (12).

10. The combination of claim 4, wherein opposite the side of the first spacer (12) facing away from the second spacer (15), at a distance therefrom, a side plate (14) running at right angles to the first connecting element (21) and connected thereto is present and is connected to the second spacer (15) by means of a connecting bar (23) extending from the edge of the side plate (14) running parallel to and at a distance from the first connecting element (21) at a distance from the bending edge (13) of the first spacer.

11. The combination of claim 1, wherein the bending edge (13) of the first spacer (12) has a raised part (24) at the insertion side of the device.

12. The combination of claim 4, wherein the bending edge (16) of the second spacer (15) lies at a distance from the insertion face of the flexible circuit along a length which is equal to or greater than the width of the flexible circuit part to be bent around it.

13. The combination of claim 1, made of insulating material.

* * * * *